United States Patent [19]
Ichimura et al.

[11] Patent Number: 5,835,419
[45] Date of Patent: Nov. 10, 1998

[54] SEMICONDUCTOR MEMORY DEVICE WITH CLAMPING CIRCUIT FOR PREVENTING MALFUNCTION

[75] Inventors: Tooru Ichimura; Hiromi Okimoto; Masanori Hayashikoshi; Youichi Tobita, all of Hyogo, Japan

[73] Assignee: Mitsubishi Denki Kabushiki Kaisha, Tokyo, Japan

[21] Appl. No.: 807,742

[22] Filed: Feb. 27, 1997

[30] Foreign Application Priority Data

| Mar. 1, 1996 | [JP] | Japan | 8-045255 |
| Jul. 26, 1996 | [JP] | Japan | 8-198204 |
| Dec. 2, 1996 | [JP] | Japan | 8-321950 |

[51] Int. Cl.⁶ .................................................. G11C 16/04
[52] U.S. Cl. .................................... 365/189.06; 365/204
[58] Field of Search .................... 365/189.06, 200, 365/230.06, 204, 206

[56] References Cited

U.S. PATENT DOCUMENTS

| 4,347,586 | 8/1982 | Natsui | 365/189.06 |
| 4,513,399 | 4/1985 | Tobita | 365/189.06 |
| 4,610,002 | 9/1986 | Kaneko | 365/189.06 |
| 4,760,559 | 7/1988 | Hidaka et al. | 365/189.05 |
| 5,161,121 | 11/1992 | Cho | 365/189.06 |
| 5,204,842 | 4/1993 | Umeki | 365/230.03 |
| 5,307,307 | 4/1994 | Wada et al. | 365/189.06 |
| 5,363,331 | 11/1994 | Matsui et al. | 365/189.06 |
| 5,465,233 | 11/1995 | Slemmer | 365/200 |

FOREIGN PATENT DOCUMENTS

| 0107921 | 5/1984 | European Pat. Off. . |
| 0115127 | 8/1984 | European Pat. Off. . |
| 0160392 | 11/1985 | European Pat. Off. . |
| 0299087 | 1/1989 | European Pat. Off. . |
| 2191202 | 2/1974 | France . |
| 4434105 | 3/1995 | Germany . |
| 01081250 | 3/1989 | Japan . |
| 2-7286 | 1/1990 | Japan . |
| 4-17197 | 1/1992 | Japan . |
| 4-183000 | 6/1992 | Japan . |
| 5-210978 | 8/1993 | Japan . |
| 7-122098 | 5/1995 | Japan . |
| 2181894 | 4/1987 | United Kingdom . |

*Primary Examiner*—David C. Nelms
*Assistant Examiner*—Hoai Ho
*Attorney, Agent, or Firm*—McDermott, Will & Emery

[57] ABSTRACT

A semiconductor memory device includes: subarrays having memory cells each arranged at cross points of a plurality of bit lines and a plurality of word lines; a row decoder for selecting among the word lines; a column decoder for supplying a select signal to transfer gates for selecting among paired bit lines; and a clamping circuit for fixing the potential of a column select line at a constant potential before the column decoder is activated.

14 Claims, 19 Drawing Sheets

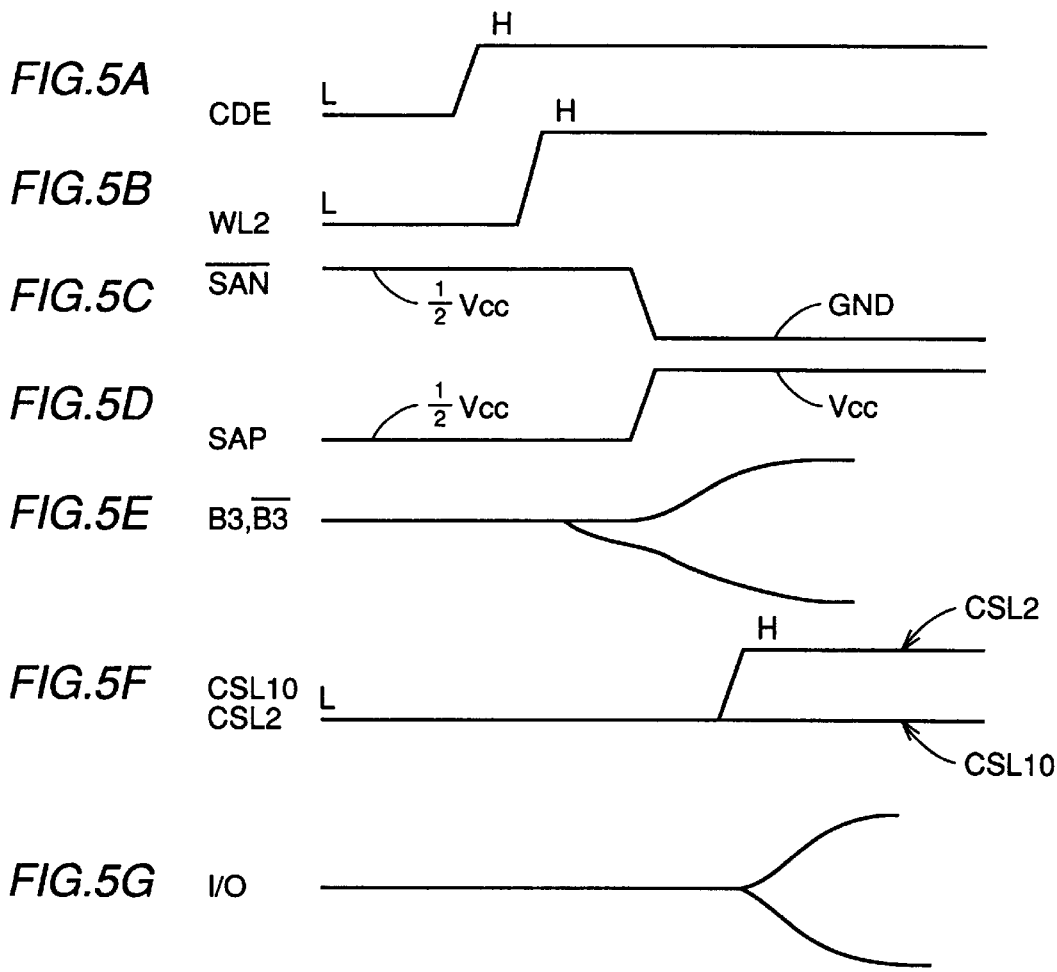
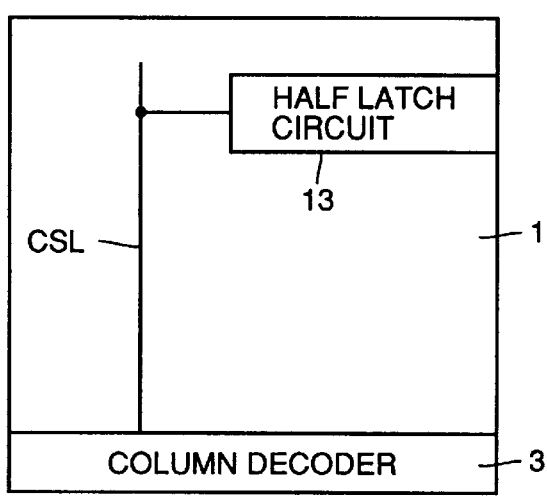

½ Vcc 5,835,419

SEMICONDUCTOR MEMORY DEVICE WITH CLAMPING CIRCUIT FOR PREVENTING MALFUNCTION

BACKGROUND OF THE INVENTION

1. Field of the Invention

The present invention relates to a semiconductor memory device. It particularly relates to a semiconductor memory device provided with a clamping circuit which prevents malfunction when a column select line or a word line is disconnected by foreign matters or the like.

2. Description of the Background Art

FIG. 31 is a block diagram showing an example of a configuration of a dynamic random access memory (referred to as a "DRAM" hereinafter), a conventional semiconductor memory device.

As shown in FIG. 31, the semiconductor memory device is provided with subarrays 1 into which a memory cell array is divided, a row decoder 2 arranged at each subarray 1 for selecting a word line WL, and a column decoder 3 arranged at each subarray 1 for selecting a column select line CSL.

Furthermore, the semiconductor memory device shown in FIG. 31 is a DRAM of ×4 configuration and has a memory cell array consisting of four subarrays 1. Each subarray 1 has a plurality of word lines WL including a redundant word line, a plurality of pairs of bit lines arranged to cross the plurality of word lines WL and including a redundant pair of bit lines, and a plurality of column select lines CSL arranged parallel to the plurality of pairs of bit lines and including a redundant column select line for sending a signal for selecting a pair of bit lines. Cross points of word lines WL and the pairs of bit lines are connected to their respective memory cells (not shown) and thus the memory cells are arranged in a matrix.

One end of column select line CSL is connected to column decoder 3 and the other end is opened. Thus, when column select line CSL is disconnected due to foreign matters or the like, a redundant column select line is substituted for the column select line CSL while the disconnected portion is floating, causing multiselection of memory cells and hence malfunction of the device.

Furthermore, a word line WLn also has one end connected to row decoder 2 while the other end open. Thus, when word line WLn is disconnected due to foreign matters or the like, a redundant word line is substituted for the disconnected word line WLn while the disconnected portion is floating, causing multiselection of memory cells and hence malfunction of the device.

SUMMARY OF THE INVENTION

An object of the present invention is to clamp a column select line or a word line when the column select line or the word line is disconnected due to foreign matters or the like, so that the disconnected portion may not be floating.

A semiconductor memory device according to one aspect of the present invention includes a plurality of column select lines, a plurality of word lines, a memory cell array including a plurality of memory cells, a row decoder for selecting a word line, a column decoder for selecting a column select line, and a clamping circuit for fixing a column select line at a constant potential when the column decoder is inactivated.

A semiconductor memory device according to another aspect of the present invention includes a plurality of column select lines, a plurality of word lines, a memory cell array having a plurality of memory cells, a row decoder for selecting a word line, a column decoder for selecting a column select line, and a clamping circuit for fixing the word lines at a constant potential when the row decoder is inactivated.

A semiconductor memory device according to still another aspect of the present invention includes a plurality of first signal lines, a plurality of memory cells connected to a first signal line, a decoder selectively activating the plurality of first signal lines, a plurality of second signal lines, a plurality of redundant memory cells connected to a second signal line, a replacement circuit for replacing a first signal line with a second signal line, and a clamp circuit for fixing a first signal line replaced with a second signal line at a constant potential.

Accordingly, a main advantage of the present invention is that even when a column select line or a word line is disconnected due to foreign matters or the like, a malfunction where multiselection of memory cells is caused due to the floating, disconnected portion of the column select line or the word line can be prevented.

Another advantage of the present invention lies in the capability to clamp an original signal line replaced with a redundant signal line.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 5A–5G are timing charts illustrating data read operation when a column select line for a subarray shown in FIG. 1 is disconnected.

FIG. 6 shows the configuration of a semiconductor memory device according to a second embodiment of the present invention.

DESCRIPTION OF THE PREFERRED EMBODIMENTS

First Embodiment

Figure 1:
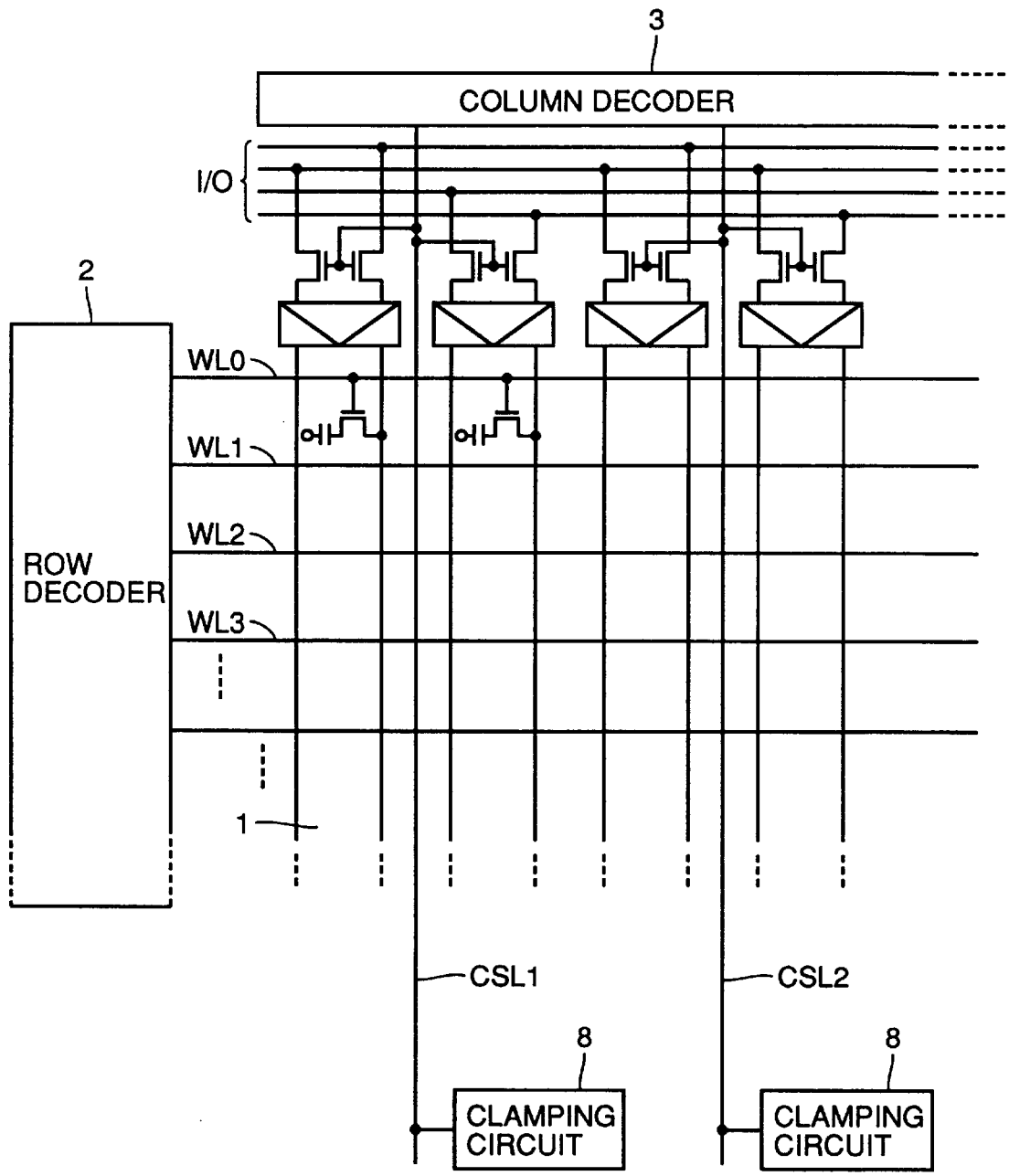
FIG. 1 shows the configuration of a semiconductor memory device according to a first embodiment of the present invention.
Figure 2:
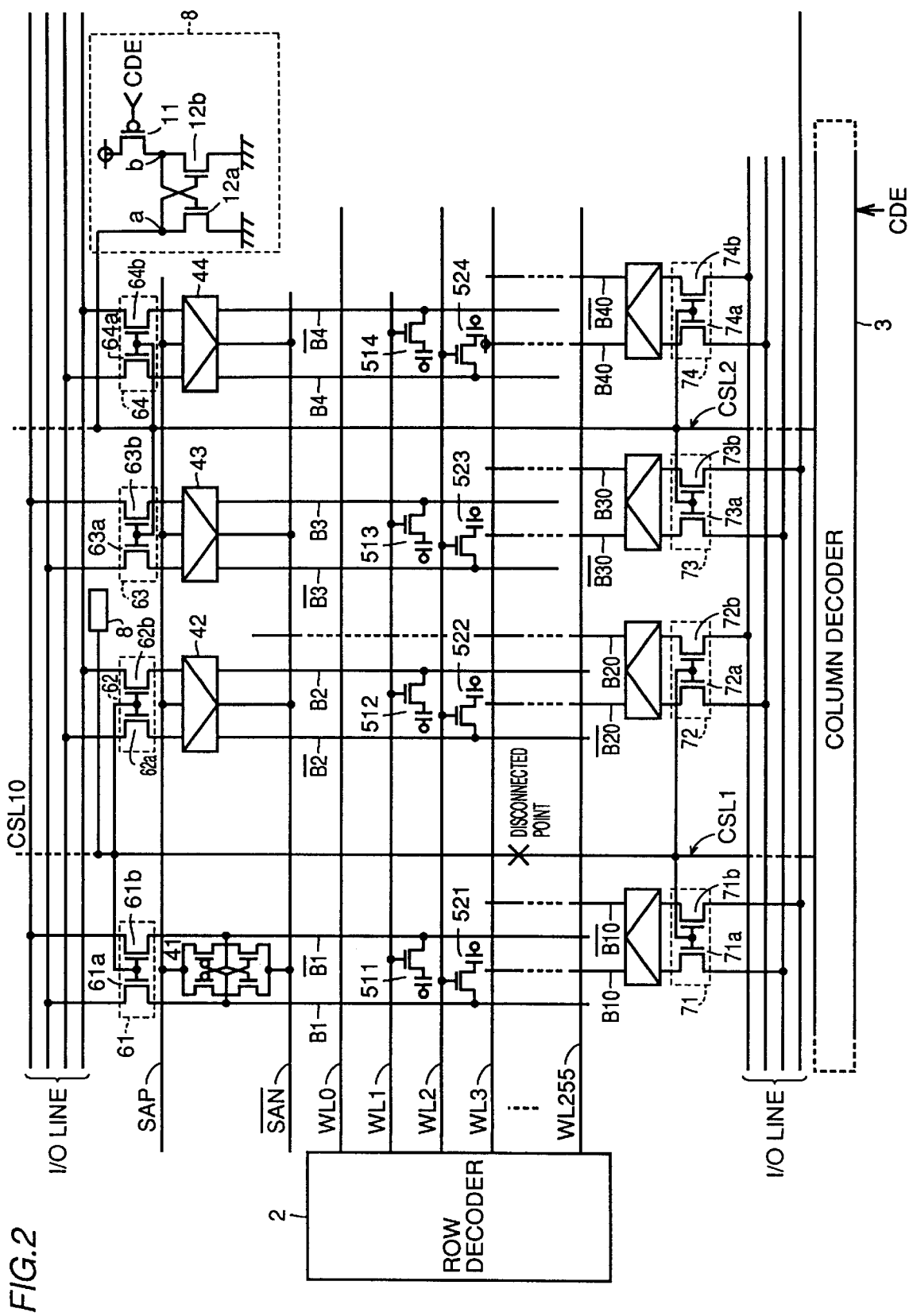
FIG. 2 specifically shows the configuration of the semiconductor memory device shown in FIG. 1.

FIG. 1 shows the configuration of a semiconductor memory device according to a first embodiment of the present invention. FIG. 2 also shows a specific configuration thereof.

FIGS. 1 and 2 do not show a redundant circuit including a redundant word line, a redundant column select line and a redundant pair of bit lines.

In FIG. 1, column decoder 3 is the same as that in the conventional semiconductor memory device described above and a description thereof will not be repeated here.

As shown in FIG. 2, the semiconductor memory device according to the first embodiment also includes sense amplifiers 41, 42, 43, 44 each connected to a pair of bit lines Bn, $\overline{Bn}$ (n=1, 2, 3, or 4), memory cells 511–514, 521–524 each arranged at a cross point of a word line WL and the pair of bit lines Bn, $\overline{Bn}$ (n=0, 1, 2, 3 or 4), transfer gates 61–64, 71–74 for selecting a pair of bit lines in response to a column select signal, and a clamping circuit 8 for clamping column select lines CSL1, CSL2.

FIG. 1 also shows an embodiment in which clamping circuits 8 are arranged each at one end of respective column select lines CSL1 and CSL2.

Figure 3:
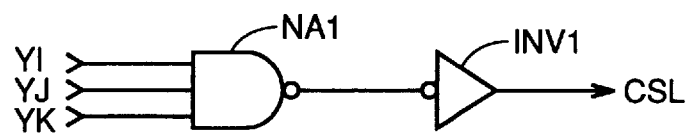
FIG. 3 is a circuit diagram of the column decoder shown in FIG. 2.

FIG. 3 is a circuit diagram of an example of column decoder 3. Predecoded signals YI, YJ and YK produced from an address is input to an NAND circuit NA1, and an inverter INV1 outputs a column select signal.

Figure 4:
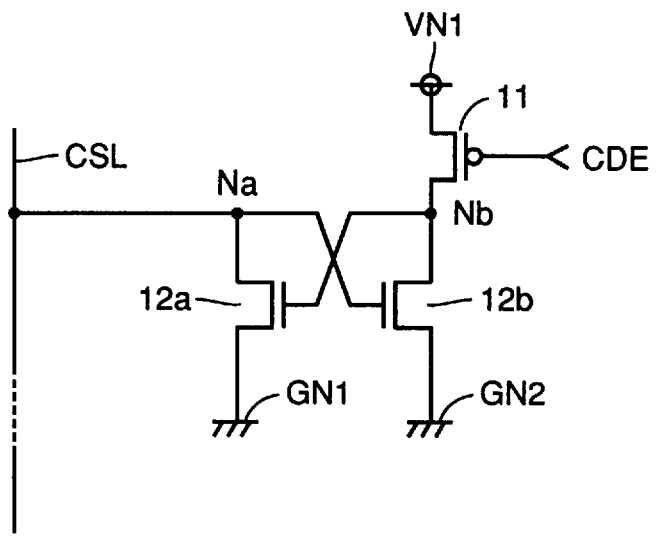
FIG. 4 is a specific circuit diagram of the configuration of the clamping circuit shown in FIG. 2.

FIG. 4 is a circuit diagram of clamping circuit 8. As shown in FIG. 4, the clamping circuit includes a p channel MOS transistor (simply referred to as a p channel transistor hereinafter) 11 and n channel MOS transistors (simply referred to as n channel transistors hereinafter) 12a, 12b.

FIGS. 5A–5G are waveform diagrams illustrating data read operation when column select line CSL1 for subarray 1 is disconnected.

The operation of a semiconductor memory device according to the first embodiment will now be described.

In the clamping circuit shown in FIG. 4, when a column decoder enable signal CDE is at inactive L level, p channel transistor 11 is turned on and the potential of a node Nb is set to H level. Then, n channel transistor 12a is turned on and the potential of a node Na is set to L level. When the column decoder enable signal CDE is set to active H level, p channel transistor 11 is turned off so that the potential of node Na is maintained at the L level and thus column select line CSL is clamped at L level.

Referring now to the waveform diagrams of FIGS. 5A–5G, the operation of subarray 1 shown in FIG. 2 will be described.

As shown in FIG. 5A, prior to data read operation (i.e., in a stand-by state), column decoder enable signal CDE is at inactive L level, so that p channel transistor 11 is turned on to set node Nb to H level, and node Na is clamped at L level. When a data read operation is started, column decoder enable signal CDE is set to active H level and p channel transistor 11 is turned off. Furthermore, as shown in FIG. 5B, a word line WL2 selected by row decoder 2 is activated and transfer gates for memory cells 521–524 connected to word line WL2 are turned on, so that data written in each of the memory cells is read out on one of the paired bit lines. Then, as shown in FIG. 5C, when the level of a sense amplifier driving signal $\overline{SAN}$ input to an n channel flipflop is changed from Vcc/2 to GND and a sense amplifier driving signal SAP input to a p channel flipflop is changed from Vcc/2 to Vcc, sense amplifiers 41–44 are activated whereby a potential difference, for example, between paired bit lines B3 and $\overline{B3}$ and as shown in FIG. 5E is sensed and the data read operation is thus completed.

As clamping circuit 8 clamps a disconnected portion CSL10 of column select line CSL1 shown in FIG. 2 at L level as shown in FIG. 5F, transfer gates 61a, 61b, 62a, 62b are turned off so that neither fluctuations of potential of an I/O line nor multiselection of memory cells, which would be caused in conventional circuits, is caused.

When column decoder enable signal CDE is activated and column select line CSL2 is selected, column select line CSL2 is set to H level, as shown in FIG. 5F and transfer gates 63a, 63b, 73a, 73b, 64a, 64b, 74a, 74b are turned on, so that pairs of bit lines B3 and $\overline{B3}$, B4 and $\overline{B4}$, B30 and $\overline{B30}$, B40 and $\overline{B40}$ are connected to an I/O line, and data written in the memory cells are accurately read out via the I/O line to a data bus.

The column decoder shown in FIG. 3 functions to decode predecoded signals YI, YJ, YK into a signal having L level potential or a signal having H level potential and serves to clamp a non-selected column select line CSL at L level potential. Accordingly, in a semiconductor memory device according to the first embodiment, column select lines CSL1 and CSL2 both have respective clamping circuits, each at one end.

In the semiconductor memory device according to the first embodiment, as clamping circuit 8 is provided opposite to column decoder 3 at one end of column select line CSLn, it is ensured that column select line CSL1 or CSL2 is clamped at L level. Thus, even when column select line CSL1 or CSL2 is disconnected, the disconnected portion will not float.

While preferably clamping circuit 8 is disposed opposite to column decoder 3, a plurality of clamp circuits 8 may be disposed at any portions, and the same applies to the following second, third, fourth and seventh embodiments.

Second Embodiment

FIG. 6 is a block diagram of the configuration of a semiconductor memory device according a second embodiment of the present invention.

In the semiconductor memory device according to the second embodiment, as shown in FIG. 6, a half-latch circuit 13 is provided opposite to column decoder 3 for column select line CSL to fix column select line CSL at L level.

Figure 7:
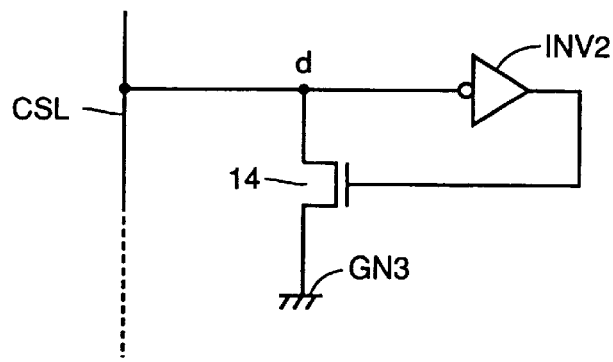
FIG. 7 is a circuit diagram illustrating a specific configuration of the half-latch circuit shown in FIG. 6.

FIG. 7 is a circuit diagram of an exemplary specific configuration of the half-latch circuit shown in FIG. 6. The half-latch circuit includes an inverter INV2 and an n channel transistor 14. When the potential of a node d is at L level, the output of inverter INV2 is set to H level and n channel transistor 14 is turned on so that the potential of node d is maintained at the L level. Thus, column select line CSL is fixed at L level (i.e., GND level). Therefore, the semiconductor memory device according to the second embodiment achieves a similar effect to that of a semiconductor memory device according to the first embodiment.

Third Embodiment

Figure 8:
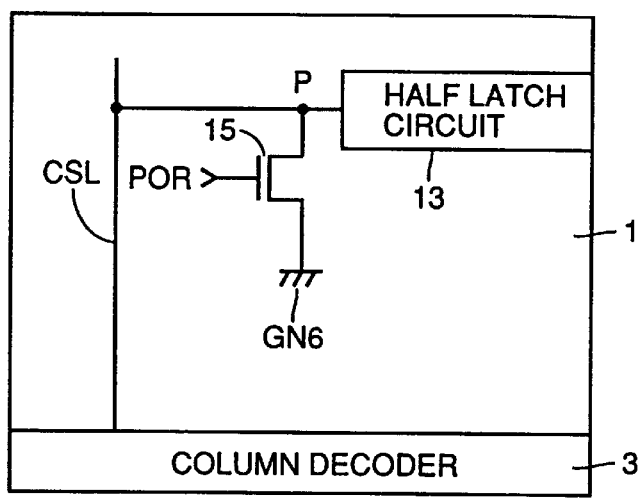
FIG. 8 shows the configuration of a semiconductor memory device according to a third embodiment of the present invention.

FIG. 8 is a block diagram of the configuration of a semiconductor memory device according to a third embodiment of the present invention. In the semiconductor memory device according to the third embodiment, as shown in FIG. 8, an N channel transistor 15 receiving a power on reset signal POR at its gate is also provided between column select line CSL and half-latch circuit 13 in the semiconductor memory device according to the second embodiment.

Figure 9:
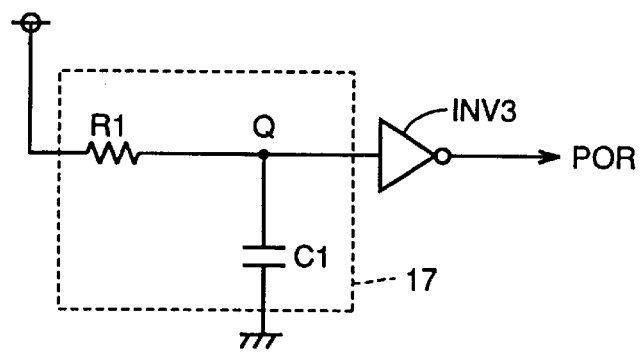
FIG. 9 is a circuit diagram illustrating a specific configuration of a power on reset circuit for generating power on reset signals shown in FIG. 8.

FIG. 9 is a circuit diagram of a power on reset circuit for generating the power on reset signal. As shown in FIG. 9, the power on reset circuit includes an integration circuit 17 configured by a resistance R1 and a capacitor C1, and an inverter INV3 receiving an output of integration circuit 17.

Figure 10:
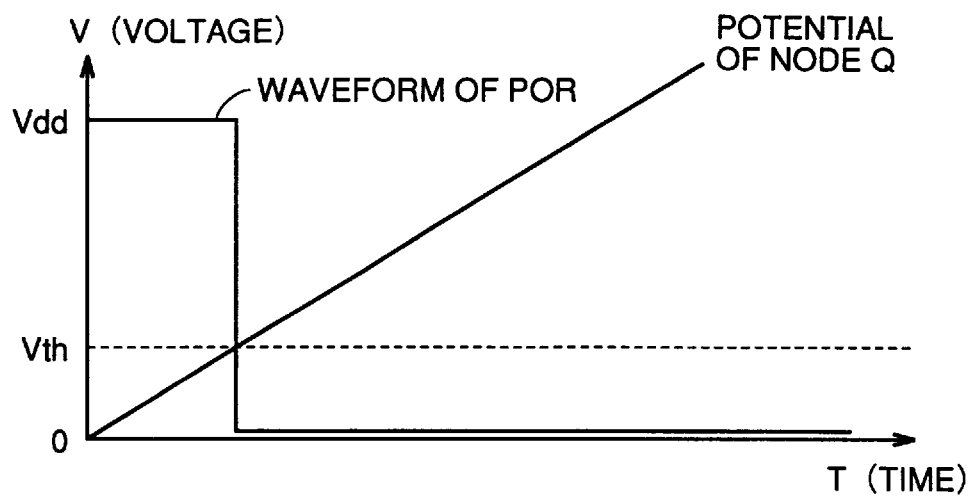
FIG. 10 is a timing chart illustrating operation of the power on reset circuit shown in FIG. 9.

FIG. 10 is a timing chart illustrating the operation of the power on reset circuit. In the power on reset circuit, electric charges are stored in capacitor C1 via resistance R1 at power-on, resulting in the potential of a node Q shown in FIG. 9. When the potential of node Q is below a threshold voltage Vth, power on reset signal POR is at a power supply potential Vdd (=Ext.Vcc) or H level. When the potential of node Q reaches or exceeds the threshold voltage, power on reset signal POR is set to L level (i.e., GND level). Thus, since n channel transistor 15 is turned on at the time of power-on, the potential of node P is set to L level. Thus, the potential of node P in FIG. 8 is set to L level so that the output of inverter INV2 of half-latch circuit 13 shown in FIG. 7 is set to H level. Then, n channel transistor 14 is turned on and the potential of node P is maintained at the L level.

Thus, in the semiconductor memory device according to the third embodiment, it is ensured that column line CSL is clamped at L level at the time of power-on.

Fourth Embodiment

Figure 11:
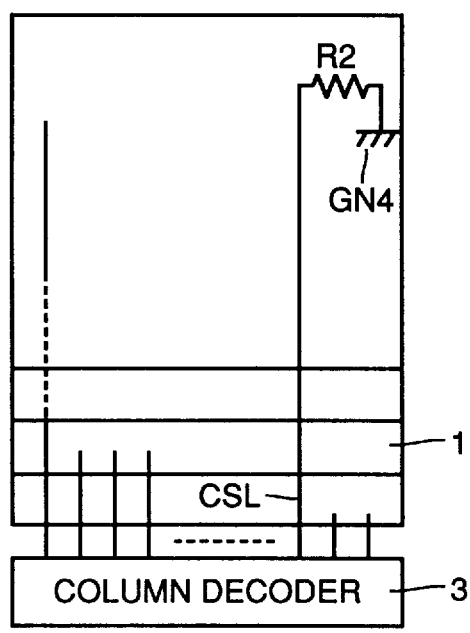
FIG. 11 shows the configuration of a semiconductor memory device according to a fourth embodiment of the present invention.

FIG. 11 shows the configuration of a semiconductor memory device according to a fourth embodiment of the present invention.

In the semiconductor memory device, as shown in FIG. 11, a high resistance R2 is connected, opposite to column decoder 3, to one end of column select line CSL, to clamp column select line CSL at L level.

The magnitude of high resistance R2 is adapted to be large enough to normally activate column select line CSL.

The semiconductor memory device according to the fourth embodiment also achieves a similar effect to that of the semiconductor memory device according to the first embodiment.

Fifth Embodiment

Figure 12:
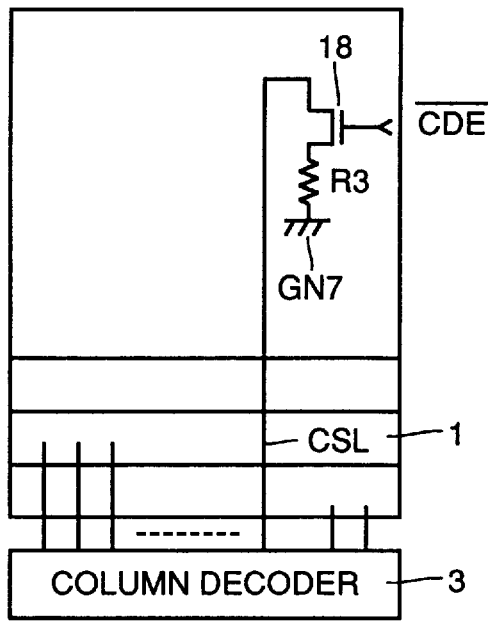
FIG. 12 shows the configuration of a semiconductor memory device according to a fifth embodiment of the present invention.

FIG. 12 shows the configuration of a semiconductor memory device according to a fifth embodiment of the present invention.

As shown in FIG. 12, the semiconductor memory device is provided with an n channel transistor 18 receiving a signal $\overline{CDE}$ at its gate, and a high resistance R3 connected to the source of n channel transistor 18 for preventing current from flowing through a selected column select line CSL when column decoder enable signal CDE is at active H level.

Combination of the fifth embodiment and any of the other embodiments further enhances reliability of column select line CSL.

Sixth Embodiment

Figure 13:
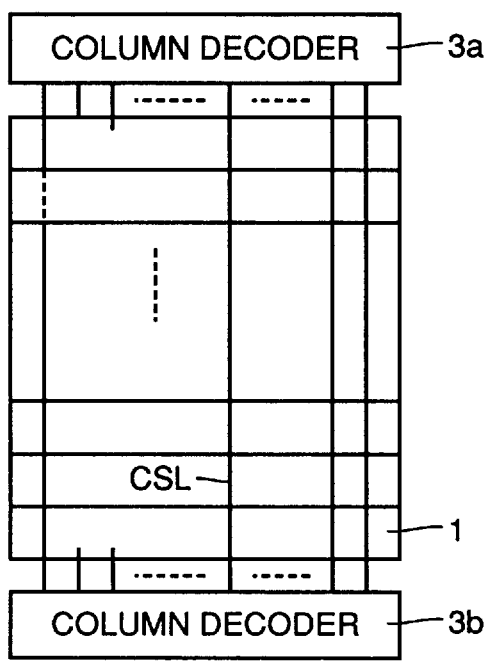
FIG. 13 shows the configuration of a semiconductor memory device according to a sixth embodiment of the present invention.

FIG. 13 is a block diagram of a semiconductor memory device according to a sixth embodiment of the present invention.

In the semiconductor memory device, as shown in FIG. 13, a column decoder 3a is provided at one end and a column decoder 3b is provided at the other end of column select line CSL.

As described in the first embodiment, since column decoders 3a, 3b function to fix the potential of a non-selected column select line CSL at L level, the semiconductor memory device according to the sixth embodiment achieves a similar effect to that of the first embodiment.

Seventh Embodiment

Figure 14:
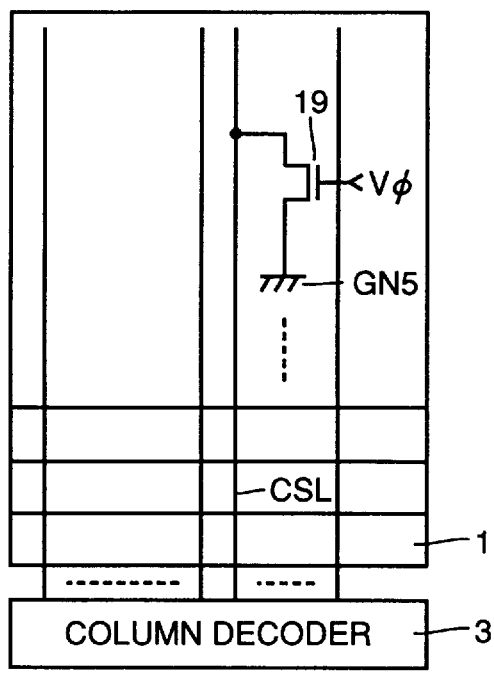
FIG. 14 shows the configuration of a semiconductor memory device according to a seventh embodiment of the present invention.

FIG. 14 shows a semiconductor memory device according to a seventh embodiment of the present invention. As shown in FIG. 14, in the semiconductor memory device, an n channel transistor 19 receiving a signal Vφ at its gate is provided, opposite to column decoder 3, at one end of column select line CSL to clamp column select line CSL at L level via a high resistance.

Since the size of n channel transistor 19 is adapted to be sufficiently smaller than that of a transistor for driving column select line CSL (not shown), column select line CSL is normally activated.

Furthermore, the signal Vφ always supplied to the gate of n channel transistor 19 is adapted to set to a level at which n channel transistor 19 slightly turns on or to be half the magnitude of a power supply voltage.

Figure 15:
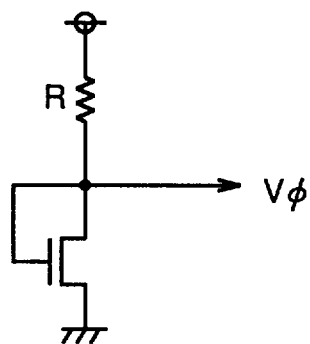
FIG. 15 is a circuit diagram showing a circuit which generates the signal Vφ a for slightly turning on the n channel transistor shown in FIG. 14.
Figure 16:
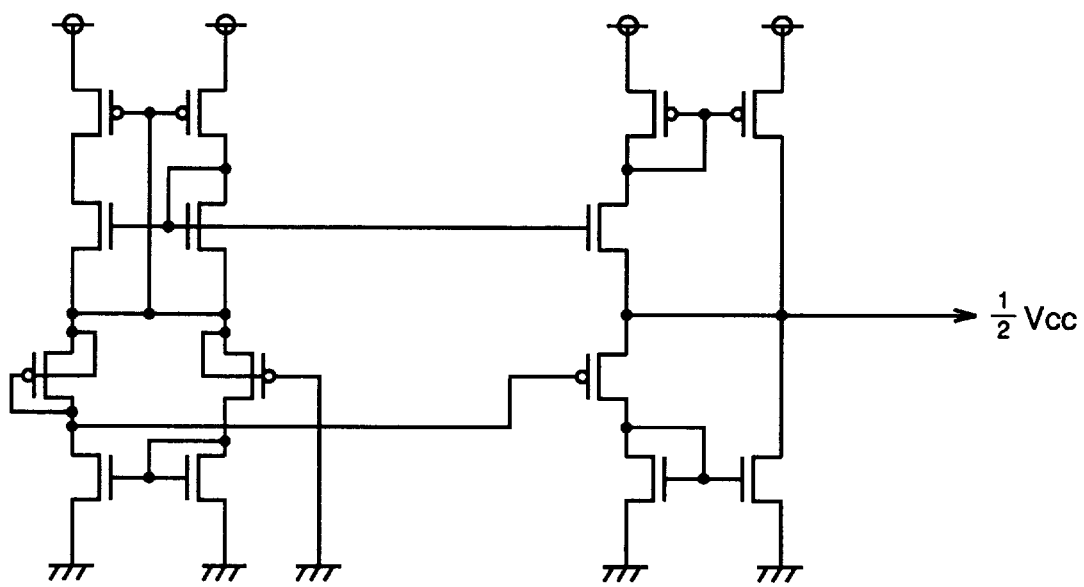
FIG. 16 is a circuit diagram showing a circuit for generating a signal Vφ when the magnitude of the signal Vφ is half that of that of a power supply voltage.

Specifically, the signal Vφ having a level at which n channel transistor 19 slightly turns on is generated by the circuit shown in FIG. 15, and the signal Vφ having half the magnitude of the power supply voltage is generated by the circuit shown in FIG. 16.

The semiconductor memory device according to the seventh embodiment also achieves a similar effect to that of a semiconductor memory device according to the first embodiment.

All of the above embodiments are not limited to an arrangement in which clamping circuit 8 is disposed opposite to column decoder 3, while such an arrangement is preferable. The number of clamping circuits is not limited, either.

Eighth Embodiment

Figure 17:
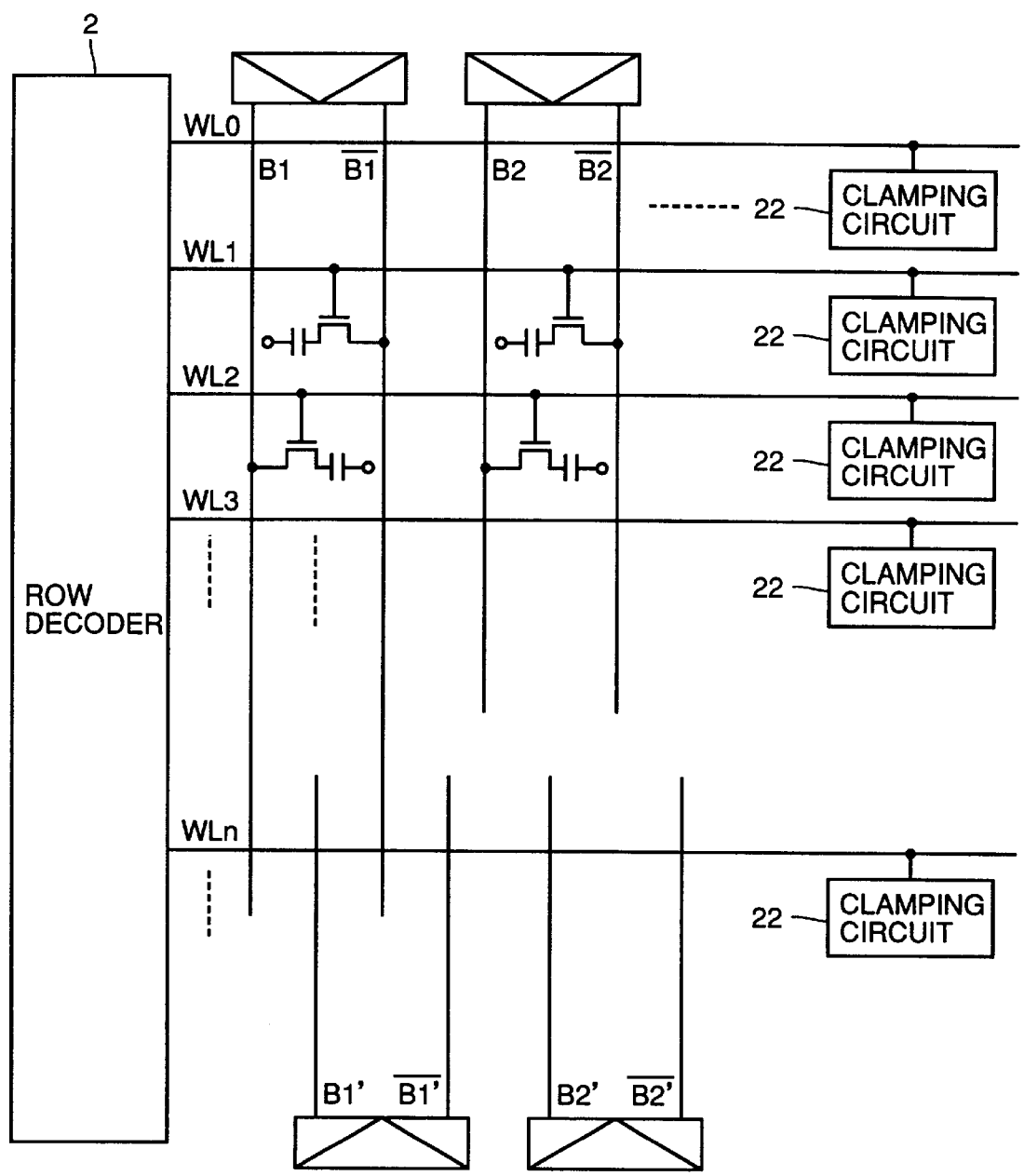
FIG. 17 is a block diagram showing the configuration of a semiconductor memory device according to an eighth embodiment of the present invention.

FIG. 17 shows the configuration of a semiconductor memory device according to an eighth embodiment of the present invention.

In the semiconductor memory device according to the eighth embodiment, as shown in FIG. 17, a clamping circuit 22 is provided at a word line WLn at an end opposite to a row decoder 2.

Figure 18:
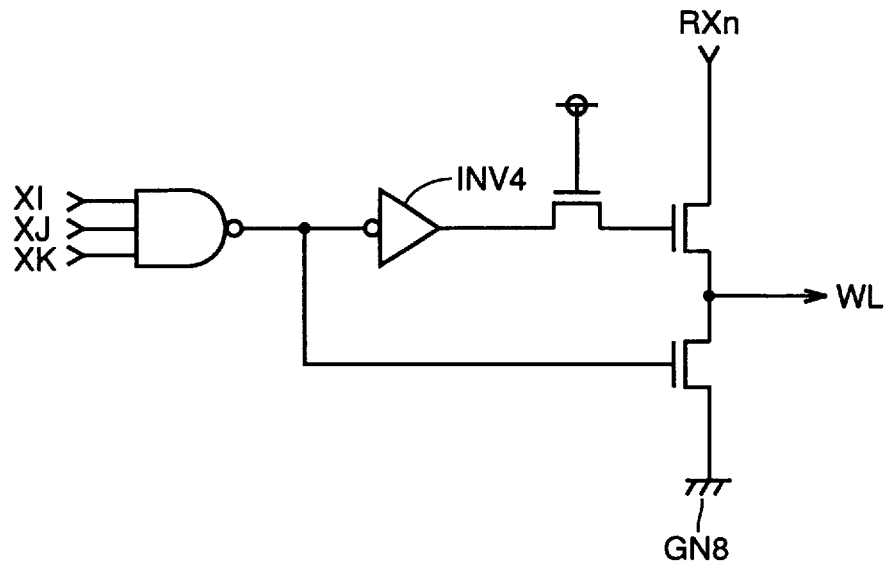
FIG. 18 is a circuit diagram showing one example of the configuration of the row decoder shown in FIG. 17.

FIG. 18 is a circuit diagram showing one example of row decoder 2. In FIG. 18, $X_I$, $X_J$ and $X_K$ represent predecoded signals produced from an address. RXn represents a select signal produced from the address for selecting one word line WL.

The row decoder shown in FIG. 18 decodes addresses into either L level potential or H level potential and clamps a non-selected word line WL at L level potential.

Figure 19:
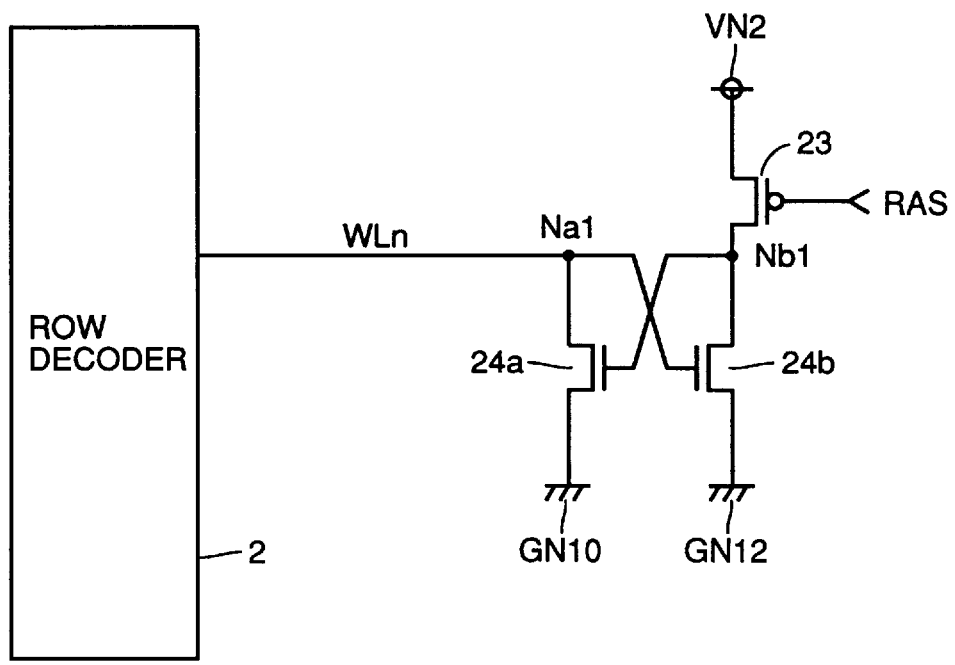
FIG. 19 is a circuit diagram showing the configuration of the clamping circuit shown in FIG. 17.

FIG. 19 is a circuit diagram showing a specific configuration of clamping circuit 22 shown in FIG. 17.

In the clamping circuit shown in FIG. 19, for a period during which the row address control signal RAS is inactivated (that is, a period during which $\overline{RAS}$ is at H level), a p channel transistor 23 turns on and the potential of a node Nb1 is set to H level, and an n channel transistor 24a turns on. Accordingly, the potential of a node Na1 is set to L level. When the row address control signal RAS is set to an active H level, p channel transistor 23 turns off, so that the potential of node Na1 is held at L level and word line WLn is clamped at L level.

In the semiconductor memory device according to the eighth embodiment, the both ends of word line WLn are clamped by row decoder 2 and clamping circuit 22.

Thus, according to this semiconductor memory device, even when word line WLn is disconnected, the disconnected portion does not float.

Although clamping circuit 22 is desirably provided at word line WLn at an end opposite to row decoder 2, the present embodiment is not limited to this and clamping circuits may be provided at any portions. This applies to the ninth to eleventh and thirteenth embodiments described hereinafter.

Ninth Embodiment

Figure 20:
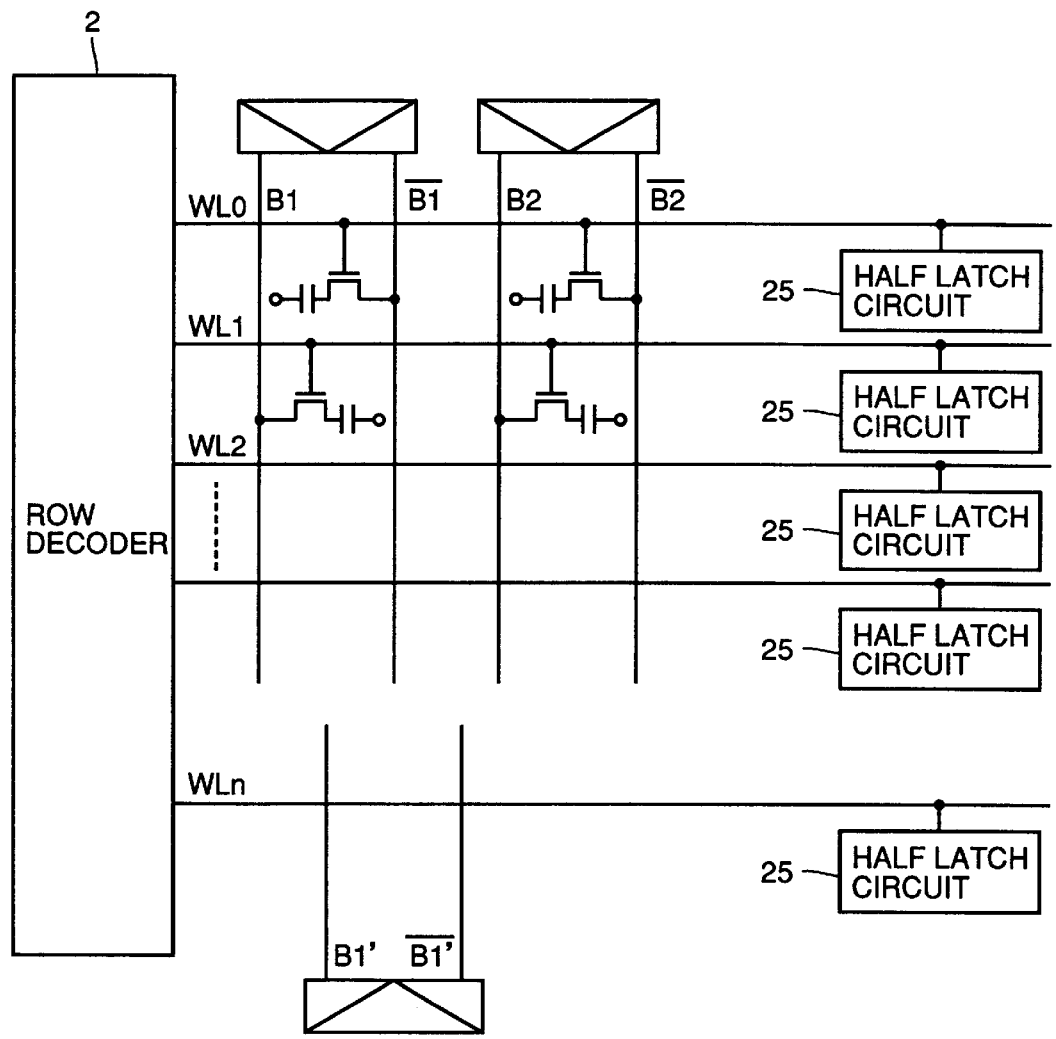
FIG. 20 is a block diagram showing the configuration of a semiconductor memory device according to a ninth embodiment of the present invention.

FIG. 20 shows the configuration of a semiconductor memory device according to a ninth embodiment. As shown in FIG. 20, a half latch circuit 25 is provided at word line WLn opposite to row decoder 2 and clamps word line WLn at L level.

Figure 21:
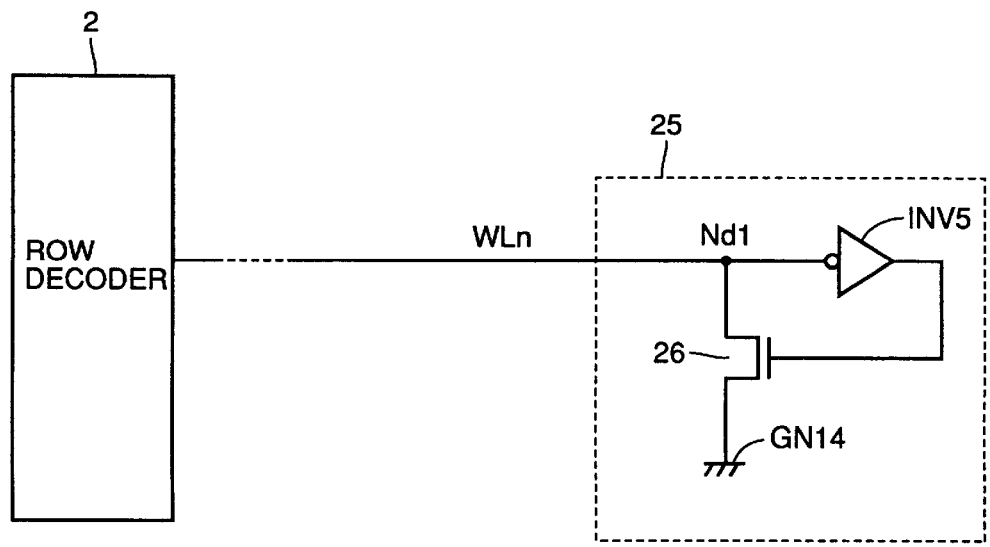
FIG. 21 is a circuit diagram showing the configuration of the half latch circuit shown in FIG. 20.

FIG. 21 is a circuit diagram showing the configuration of half latch circuit 25 shown in FIG. 20.

Half latch circuit 25 shown in FIG. 21 includes an inverter ILV5 and an n channel transistor 26, and when the potential of a node Nd1 is set to L level, the output of inverter INV5 is set to H level and n channel transistor 26 turns on so that the potential of node Nd1 is held at the L level.

Thus, word line WLn is fixed at L level (GND level).

Thus, the semiconductor memory device according to the present embodiment has a similar effect to that of the semiconductor memory device according to the eighth embodiment.

Tenth Embodiment

Figure 22:
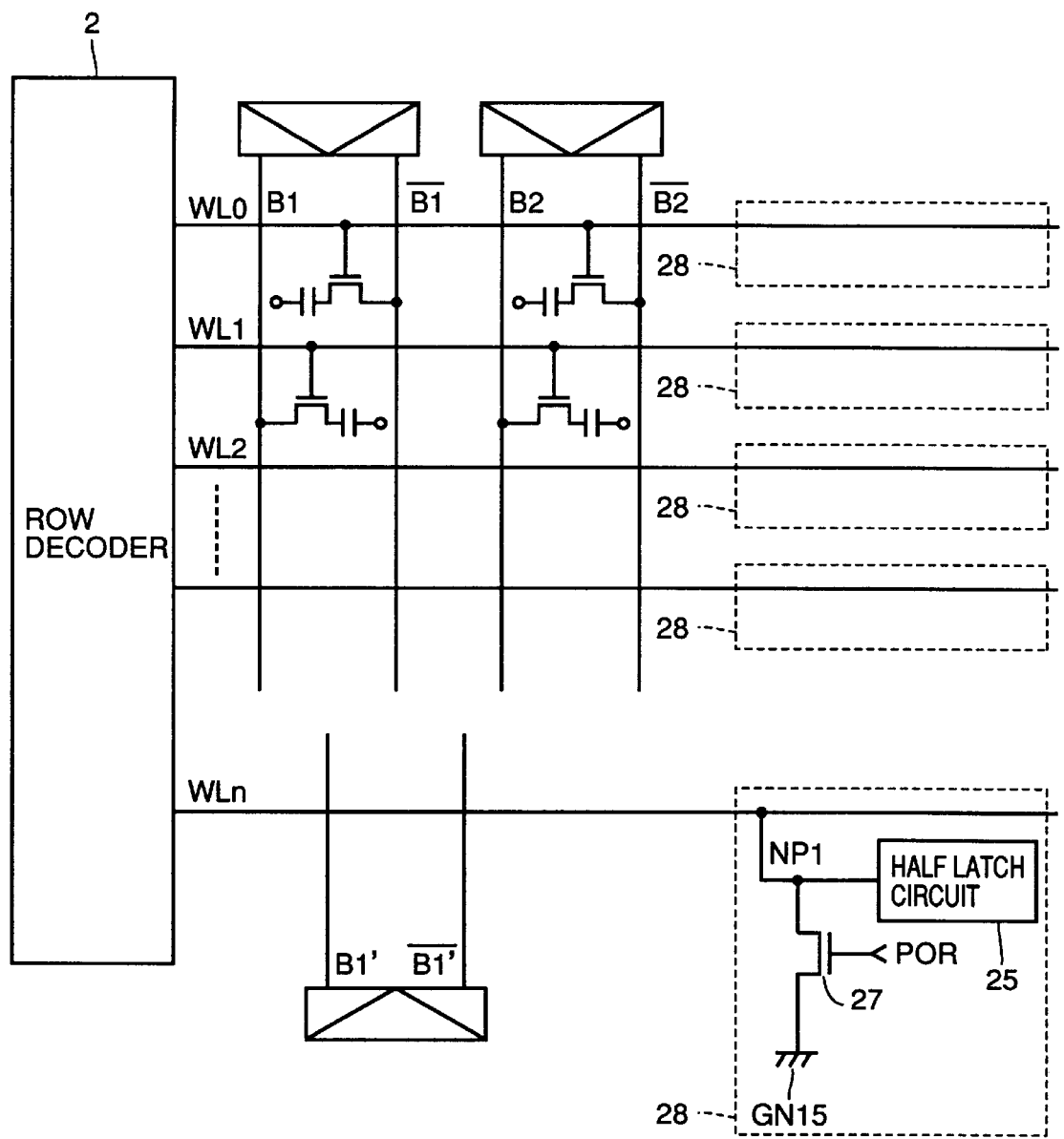
FIGS. 22–25 are block diagrams showing the configurations of semiconductor memory devices according to tenth to thirteenth embodiments of the present invention, respectively.

FIG. 22 shows the configuration of a semiconductor memory device according to a tenth embodiment. Half latch circuit 25 shown in FIG. 22 is the same as that shown in Fig.20.

Since an n channel transistor 27 which receives at its gate the power on reset signal POR output from the power on reset circuit shown in FIG. 9 is provided at word line WL at the end opposite to row decoder 2, word line WL is ensured of being clamped at L level at the time of power-on.

The operation of the power-on reset circuit is the same as that described in the third embodiment. The configuration of half latch circuit 25 is the same as that shown in FIG. 21.

In FIG. 22, since n channel transistor 27 turns on by inputting of a high level power on reset signal POR to the gate at the time of power-on, the potential of a node NP1 (Nd1) is set to L level. Accordingly the output of inverter INV5 shown in FIG. 21 is set to H level and n channel transistor 26 turns on so that the potential of node NP1 is held at L level.

Thus, word line WL is ensured of being clamped at L level at the time of power-on.

Eleventh Embodiment

Figure 23:
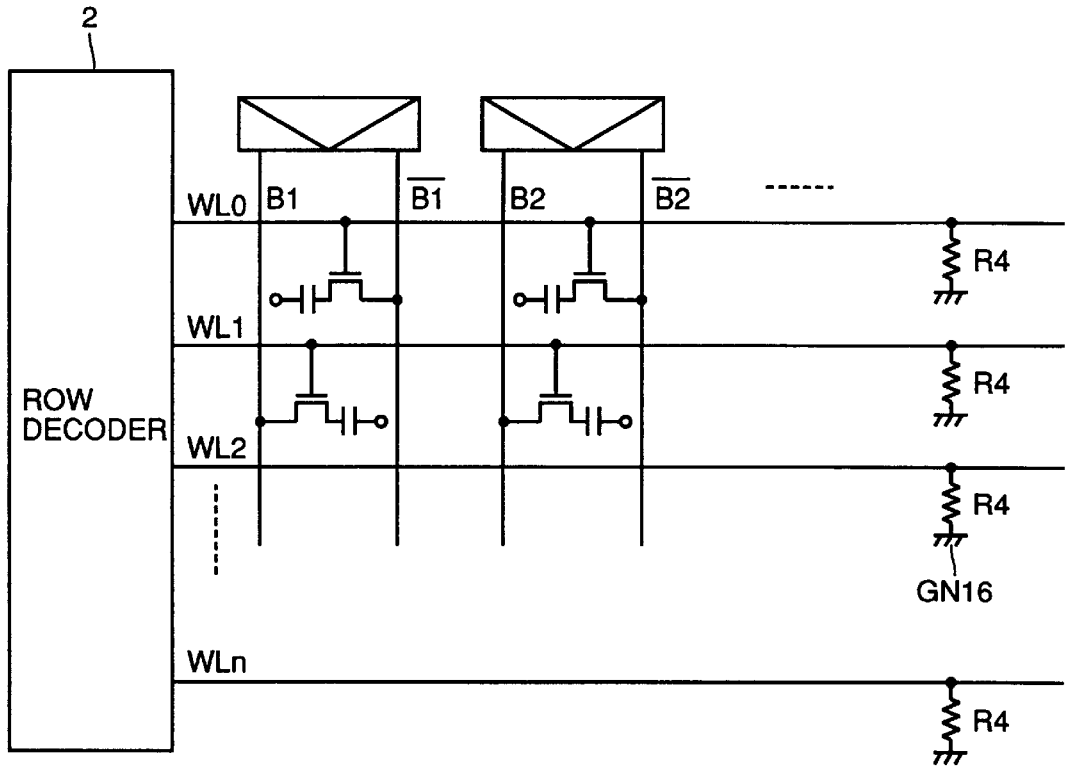

FIG. 23 shows the configuration of a semiconductor memory device according to an eleventh embodiment of the present invention.

As shown in FIG. 23, in the semiconductor memory device according to the present embodiment, a high resistance R4 having one end grounded is connected to word line WL at the end opposite to row decoder 2 to clamp word line WL at L level.

The magnitude of high resistance R4 is adapted to be large enough to normally activate word line WL.

Twelfth Embodiment

Figure 24:
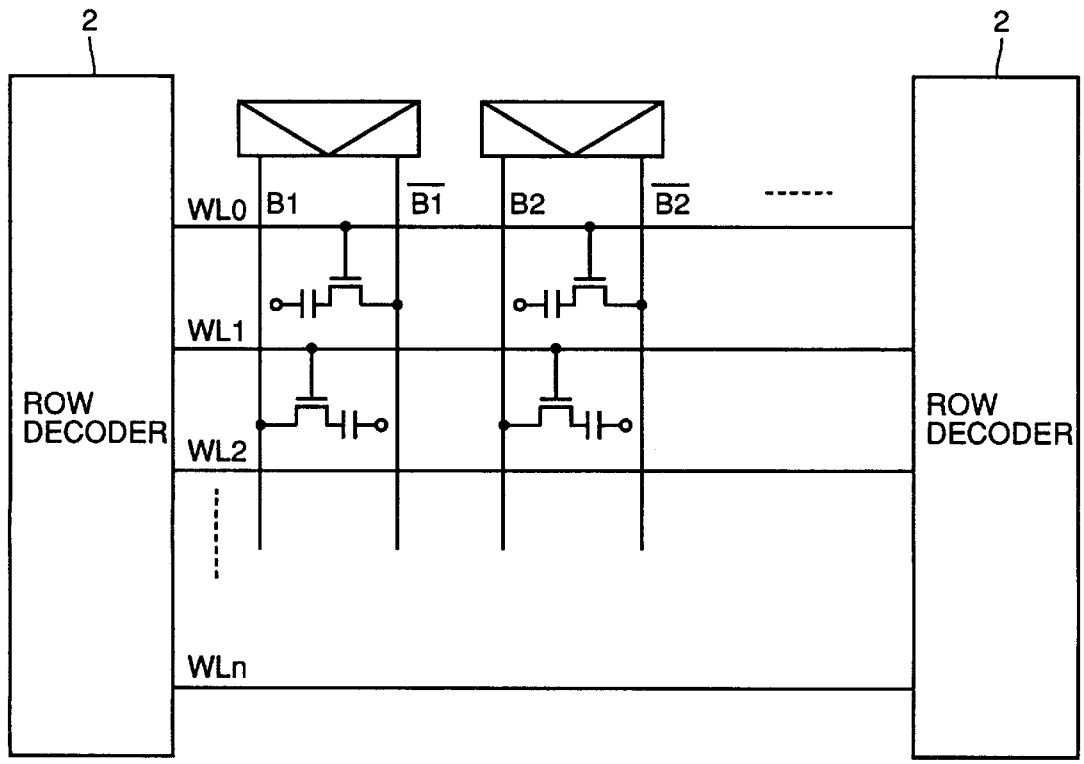

FIG. 24 shows the configuration of a semiconductor memory device according to a twelfth embodiment.

As shown in FIG. 24, in the semiconductor memory device according to the present embodiment, row decoders 2 are provided at the both ends of word line WL and clamping function of row decoders 2 is employed to clamp word line WL.

Thirteenth Embodiment

Figure 25:
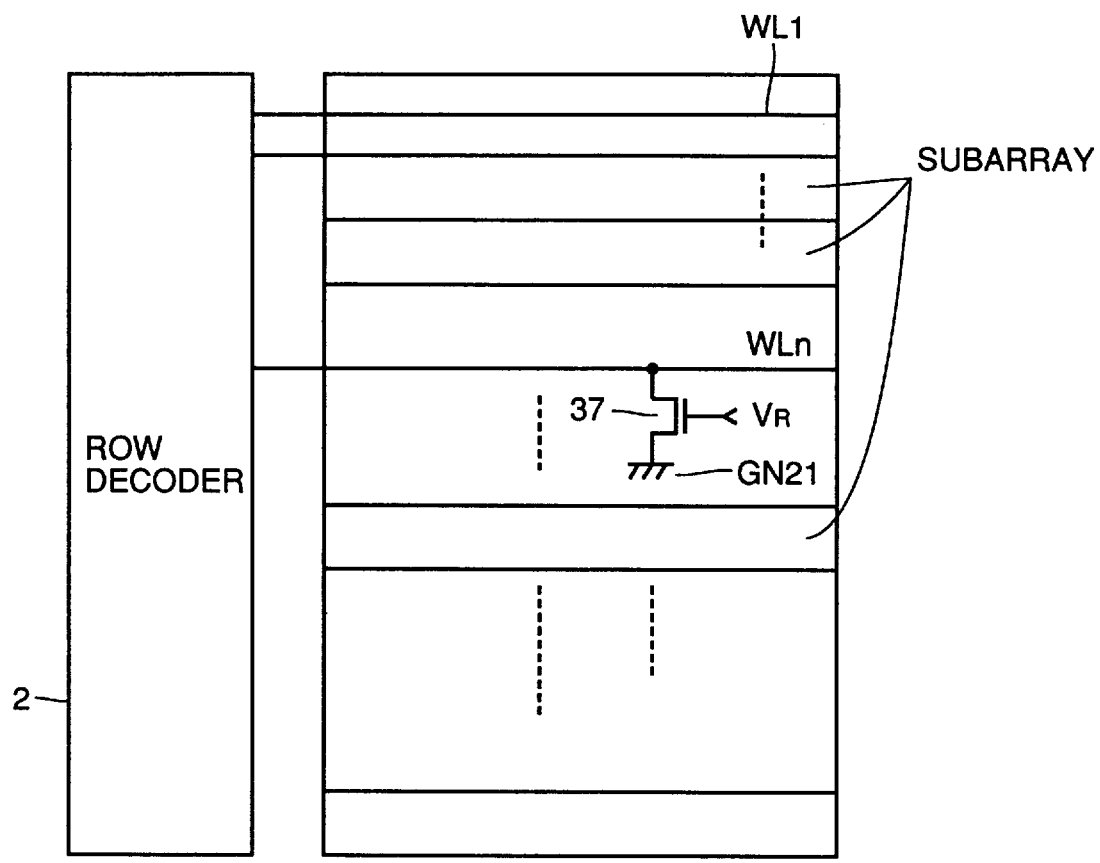

FIG. 25 shows the configuration of a semiconductor memory device according to a thirteenth embodiment of the present invention.

As shown in FIG. 25, in the semiconductor memory device according to the present embodiment, an n channel transistor 37 which always receives a signal $V_R$ at its gate is provided at word line WLn at an end opposite to row decoder 2, to clamp word line WLn at L level by high resistance. The potential of the signal $V_R$ is adapted to be at a level at which n channel transistor 37 slightly turns on or to be half the magnitude of the power supply voltage.

The size of n channel transistor 37 is adapted to be sufficiently smaller than that of a transistor (not shown) which drives word line WLn. The signal $V_R$ of the level at which n channel transistor 37 slight turns on is generated by the circuit shown in FIG. 15, as with the signal Vφ. The signal $V_R$ having half the magnitude of the power supply voltage is generated by the circuit shown in FIG. 16, as with the signal Vφ.

Although in the present embodiment also, n channel transistors 37 for clamping word lines WL are provided to word line WL one for each, not all of the n channel transistors 37 are shown in FIG. 25.

Fourteenth Embodiment

Figure 26:
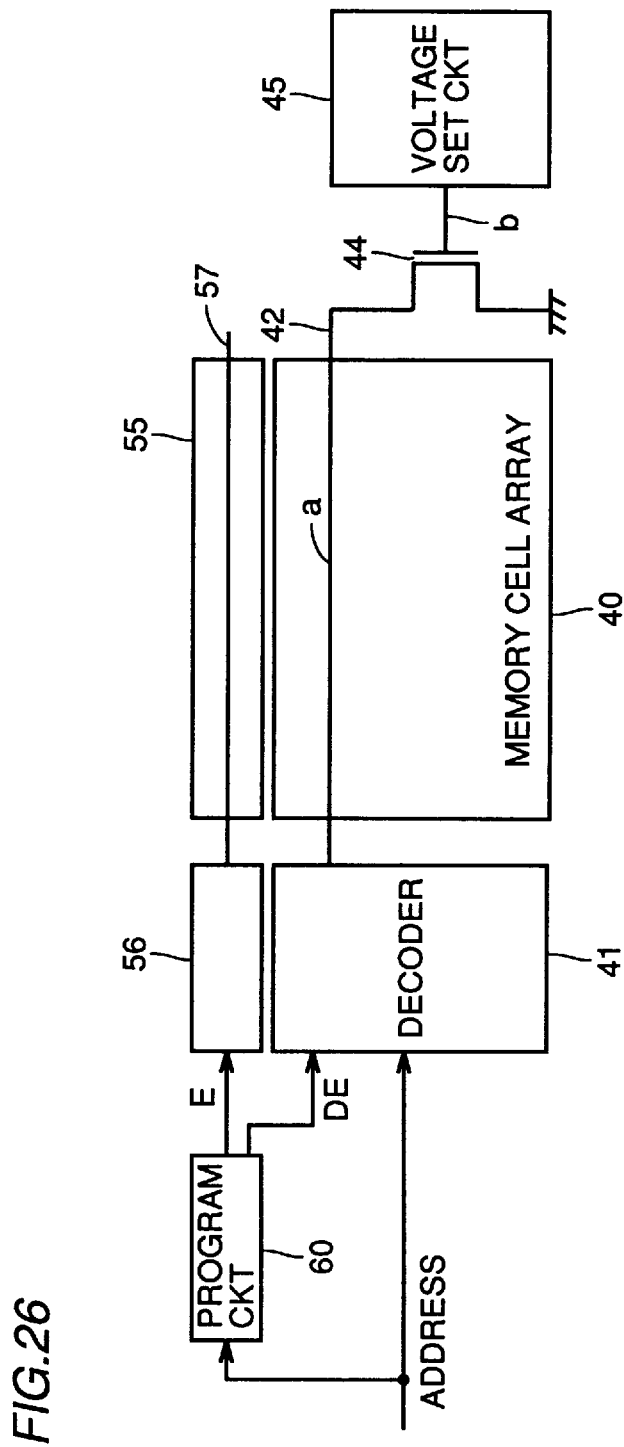
FIG. 26 shows a configuration of a semiconductor memory device according to a fourteenth embodiment of the present invention.

FIG. 26 shows a configuration of a semiconductor memory device according to a fourteenth embodiment of the present invention. As shown in the figure, the semiconductor memory device includes a memory cell array 40, a decoder 41, a signal line 42 such as a column select line and a word line selected by decoder 41, an n channel transistor 44 arranged at an end of signal line 42 opposite to decoder 41 and connected between signal line 42 and a ground node, a voltage set circuit 45 connected to the gate of n channel transistor 44 and outputting a signal b, a redundant memory cell array 55, a redundant decoder 56, a redundant signal line 57, and a program circuit 60.

Figure 27:
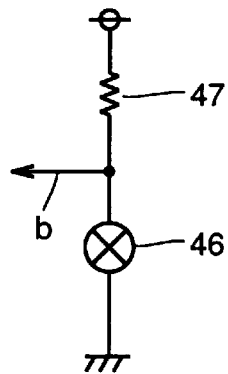
FIG. 27 is a circuit diagram showing one example of the configuration of the voltage set circuit shown in FIG. 26.

FIG. 27 is a circuit diagram showing one example of voltage set circuit 45 shown in FIG. 26. As shown in FIG. 27, voltage set circuit 45 includes a fuse 46 grounded at its one end and a resistance 47 connected between fuse 46 and a power supply node. When fuse 46 is disconnected, voltage set circuit 45 outputs a signal b of high level via resistance 47.

Figure 28:
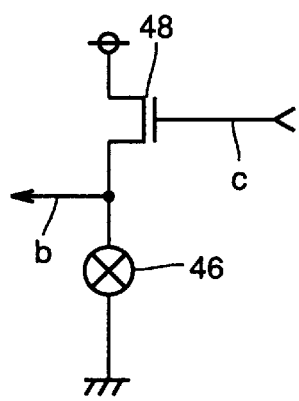
FIG. 28 is a circuit diagram showing another example of the configuration of the voltage set circuit shown in FIG. 26.

FIG. 28 is a circuit diagram showing another example of voltage set circuit 45 shown in FIG. 26. As shown in FIG. 28, voltage set circuit 45 includes fuse 46 grounded at its one end and an n channel transistor 48 connected between fuse 46 and a power supply node and receiving a signal c at its gate.

Signal c is a clock signal having such a voltage that n channel transistor 48 is slightly turned on or attaining high level only when decoder 41 is activated. When fuse 46 is disconnected, n channel transistor 48 is turned on and a signal b of high level is output.

Figure 29:
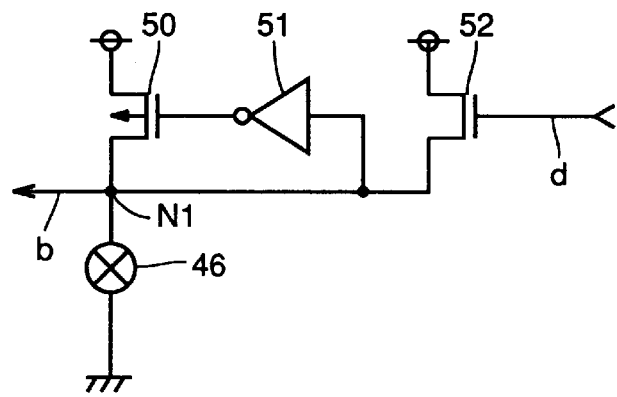
FIG. 29 is a circuit diagram showing still another example of the configuration of the voltage set circuit shown in FIG. 26.

FIG. 29 is a circuit diagram showing still another example of voltage set circuit 45 shown in FIG. 26. As shown in FIG. 29, voltage set circuit 45 includes fuse 46 grounded at its one end, a p channel transistor 50 connected between fuse 46 and a power supply node, an inverter 51 having an output terminal connected to the gate of p channel transistor 50 and having an input terminal connected to a node N1, and an n channel transistor 52 connected between the power supply node and node N1 and receiving a signal d at its gate.

When a pulse signal which attains high level only at the time of power-on is supplied to the gate of n channel transistor 52 as signal d, fuse 46 is disconnected and a signal b of high level is output from node N1.

An operation by which signal line 42 is replaced with redundant signal line 57 will now be described.

When an address which selects signal line 42 is input to program circuit 60, a disenable signal DE inactivating decoder 41 is supplied to decoder 41 and an enable signal E activating redundant decoder 56 is also supplied to redundant decoder 56 and thus redundant signal line 57 is selected. When fuse 46 included in voltage set circuit 45 is disconnected, signal b output from voltage set circuit 45 attains high level and n channel transistor 44 is turned on. This allows only signal line 42 replaced with redundant signal line 57 to be fixed at low level.

Thus, even if signal line 42 replaced with redundant signal line 57 has been disconnected, signal line 42 is fixed at low level so that there is no portion of floating level and thus malfunction is not caused.

When fuse 46 included in voltage set circuit 45 is not disconnected, signal b attains low level and current flows to the ground node via fuse 46. However, the magnitude of the current is reduced depending on the magnitude of resistance 47 or by supplying signals c and d to the gates of n channel transistors 48 and 52, as described above.

Fifteenth Embodiment

Figure 30:
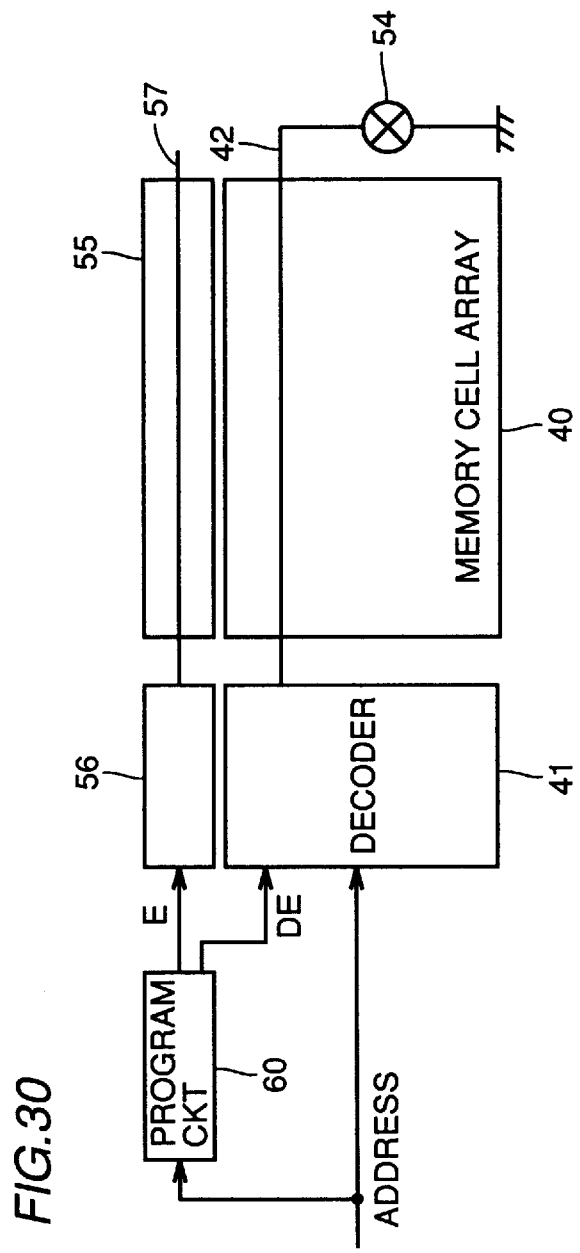
FIG. 30 shows a configuration of a semiconductor memory device according to a fifteenth embodiment of the present invention.
Figure 31:
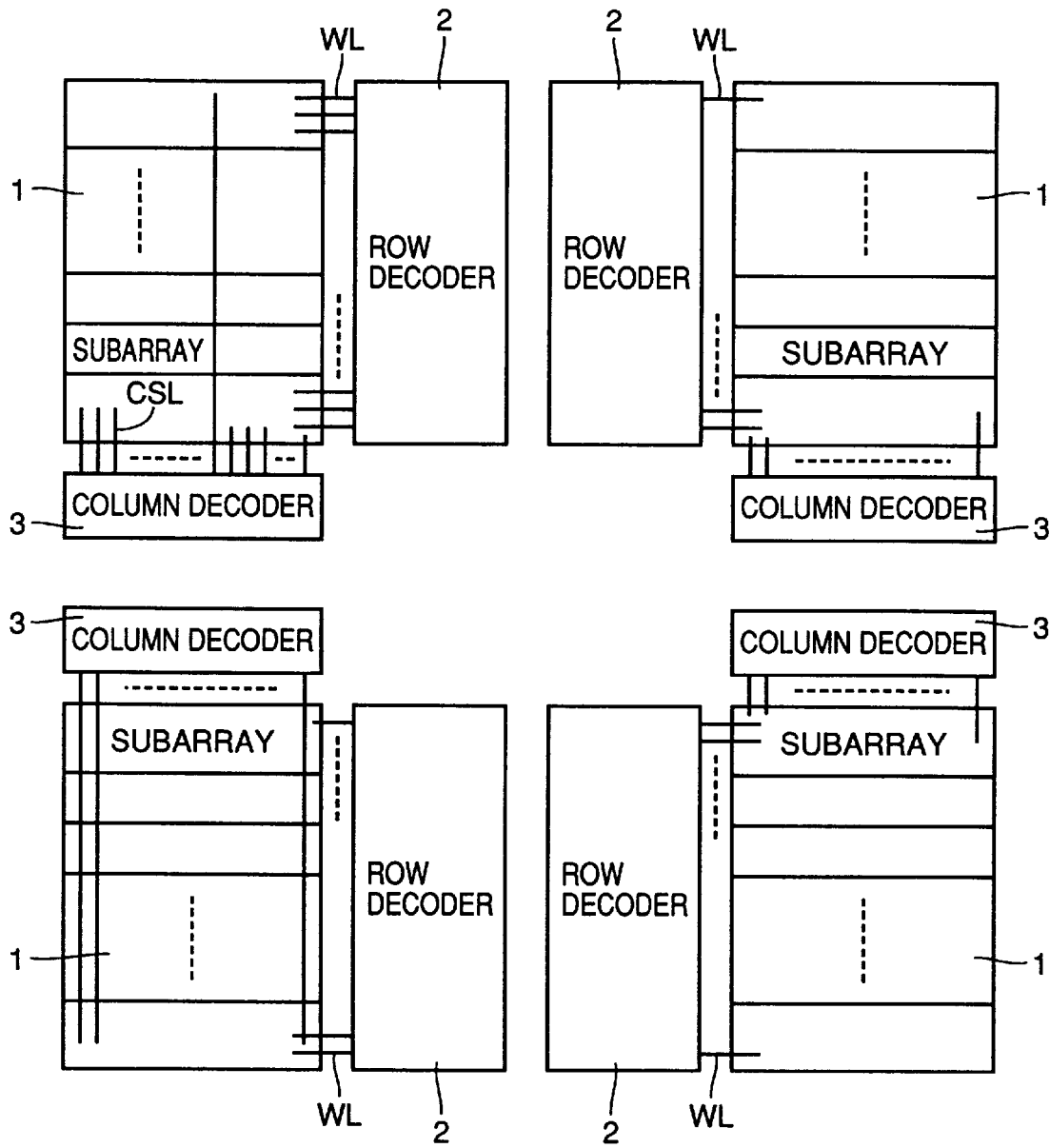
FIG. 31 shows a configuration of a conventional semiconductor memory device.

FIG. 30 shows a configuration of a semiconductor memory device according to fifteenth embodiment of the present invention. As shown in FIG. 30, the semiconductor memory device is similar in configuration to the semiconductor memory device according to the fourteenth embodiment except for a fuse 54 arranged at an end of signal line 42 opposite to decoder 41 and grounded at its one end.

In a semiconductor memory device thus configured, the fuses (not shown) for signal lines which are not replaced with redundant signal line 57 are all disconnected so that fuse 54 for the replaced signal line 42 is not disconnected.

Thus, even if signal line 42 replaced with redundant signal line 57 has been disconnected, signal line 42 is fixed at low level so that there is no portion of floating level and thus malfunction is not caused.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a plurality of column select lines arranged in columns;
   a plurality of word lines arranged in rows;
   a memory cell array including a plurality of memory cells arranged in a matrix of the columns and rows;
   a row decoder for selecting a word line among said plurality of word lines;
   a column decoder for selecting a column select line among said plurality of column select lines; and
   clamping means for clamping said plurality of column select lines at a constant potential when said column decoder is inactivated;
   wherein said clamping means is controlled in response to a control signal for activating said column decoder.

2. The semiconductor memory device according to claim 1, wherein said clamping means fixes said plurality of column select lines at a ground potential.

3. A semiconductor memory device, comprising:
   a plurality of column select lines arranged in columns;
   a plurality of word lines arranged in rows;
   a memory cell array including a plurality of memory cells arranged in a matrix of the columns and rows;
   a row decoder for selecting a word line among said plurality of word lines;
   a column decoder for selecting a column select line among said plurality of column select lines; and
   clamping means for clamping said plurality of column select lines at a constant potential when said column decoder is inactivated;
   wherein said clamping means fixes said plurality of column select lines at a ground potential; and
   wherein said clamping means includes:
      a ground node; and
      a transistor connected between any of said plurality of column select lines and said ground node, turned on in response to a reset signal produced at power-on.

4. A semiconductor memory device, comprising:
   a plurality of column select lines arranged in columns;
   a plurality of word lines arranged in rows;
   a memory cell array including a plurality of memory cells arranged in a matrix of the columns and rows;

a row decoder for selecting a word line among said plurality of word lines;

a column decoder for selecting a column select line among said plurality of column select lines; and clamping means for clamping said plurality of column select lines at a constant potential when said column decoder is inactivated;

wherein said clamping means fixes said plurality of column select lines at a ground potential, and wherein said clamping means includes:

a ground node; and a transistor connected between any of said plurality of column select lines and said ground node, said transistor having a gate supplied with a constant voltage.

5. The semiconductor memory device according to claim 2, wherein said clamping means includes:

a ground node;

a resistance element connected to said ground node; and a transistor having its source connected to said resistance element and its drain connected to any of said plurality of column select lines, said transistor being supplied with a control signal for activating said column decoder at its gate.

6. The semiconductor memory device according to claim 1, wherein said clamping means is connected at an end of any of said plurality of column select lines opposite to said column decoder.

7. A semiconductor memory device comprising:

a plurality of column select lines arranged in columns;

a plurality of word lines arranged in rows;

a memory cell array including a plurality of memory cells arranged in a matrix of the columns and rows;

a row decoder for selecting a word line among said plurality of word lines;

a column decoder for selecting a column select line among said plurality of column select lines; and clamping means for clamping said plurality of word lines at a constant potential when said row decoder is inactivated;

wherein said clamping means includes:

a first ground node;

a second ground node;

a power supply node;

a first n channel transistor having its source connected to said first ground node and having its drain connected to any one of said plurality of word lines;

a second n channel transistor having its gate connected to said first n channel transistor at its drain, its source connected to said second ground node, and its drain connected to said first n channel transistor at its gate; and a p channel transistor having its source connected to said power supply node and its drain connected to said second n channel transistor, being supplied at its gate with a row address control signal activated at high level.

8. The semiconductor memory device according to claim 7, wherein said clamping means fixes said plurality of word lines at a ground potential.

9. A semiconductor memory device, comprising:

a plurality of column select lines arranged in columns;

a plurality of word lines arranged in rows;

a memory cell array including a plurality of memory cells arranged in a matrix of the columns and rows;

a row decoder for selecting a word line among said plurality of word lines;

a column decoder for selecting a column select line among said plurality of column select lines; and clamping means for clamping said plurality of word lines at a constant potential when said row decoder is inactivated;

wherein said clamping means fixes said plurality of word lines at a ground potential, and wherein said clamping means includes:

a ground node; and a transistor connected between one of said plurality of word lines and said ground node, and turned on in response to a reset signal generated at power-on.

10. A semiconductor memory device, comprising:

a plurality of column select lines arranged in columns;

a plurality of word lines arranged in rows;

a memory cell array including a plurality of memory cells arranged in a matrix of the columns and rows;

a row decoder for selecting a word line among said plurality of word lines;

a column decoder for selecting a column select line among said plurality of column select lines; and clamping means for clamping said plurality of word lines at a constant potential when said row decoder is inactivated;

wherein said clamping means fixes said plurality of word lines at a ground potential, and wherein said clamping means includes:

a ground node; and a transistor connected between one of said plurality of word lines and said ground node, said transistor having a gate supplied with a constant potential.

11. The semiconductor memory device according to claim 7, wherein said clamping means is connected to one of said plurality of word lines at an end opposite to said row decoder.

12. A semiconductor memory device comprising;

a plurality of first signal lines;

a plurality of memory cells connected to said first signal lines;

a decoder selectively activating said plurality of first signal lines;

a plurality of second signal lines;

a plurality of redundant memory cells connected to said second signal lines;

replacing means for replacing one of said first signal lines with one of said second signal lines; and clamping means for clamping the one of said first signal lines replaced with the one of said second signal lines at a constant potential.

13. The semiconductor memory device according to claim 12, wherein said clamping means includes:

a transistor connected between the one of said first signal lines and a constant-potential node; and voltage setting means for setting the gate of said transistor at a predetermined potential.

14. The semiconductor memory device according to claim 13, wherein said voltage setting means includes a fuse and turns on said transistor by disconnecting said fuse for the one of said first signal lines replaced with the one of said second signal lines.

* * * * *